US010151434B2

(12) United States Patent
Ogata et al.

(10) Patent No.: US 10,151,434 B2
(45) Date of Patent: Dec. 11, 2018

(54) LIGHT EMITTING MODULE AND LIGHTING APPARATUS

(71) Applicant: PANASONIC INTELLECTUAL PROPERTY MANAGEMENT CO., LTD., Osaka (JP)

(72) Inventors: Toshifumi Ogata, Osaka (JP); Hiroshi Yamaguchi, Osaka (JP); Yuya Yamamoto, Osaka (JP); Keiji Kiba, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 149 days.

(21) Appl. No.: 15/452,029

(22) Filed: Mar. 7, 2017

(65) Prior Publication Data

US 2017/0261164 A1 Sep. 14, 2017

(30) Foreign Application Priority Data

Mar. 9, 2016 (JP) ................................ 2016-046362

(51) Int. Cl.
*F21S 8/02* (2006.01)
*F21V 3/02* (2006.01)
(Continued)

(52) U.S. Cl.
CPC ............. *F21S 8/026* (2013.01); *F21V 3/02* (2013.01); *F21V 7/00* (2013.01); *F21V 9/08* (2013.01);
(Continued)

(58) Field of Classification Search
CPC .. F21S 8/026; F21V 29/76; F21V 3/02; F21V 7/00; F21V 9/08; H01L 25/0753;
(Continued)

(56) References Cited

U.S. PATENT DOCUMENTS 9,163,790 B2 * 10/2015 Ogata ...................... F21K 9/56
2011/0050071 A1 * 3/2011 Chung ..................... F21K 9/00
313/46
(Continued)

FOREIGN PATENT DOCUMENTS

JP 2007-134606 5/2007
JP 2009-99715 5/2009
(Continued)

*Primary Examiner* — Mary Ellen Bowman
(74) *Attorney, Agent, or Firm* — Greenblum & Bernstein, P.L.C.

(57) ABSTRACT

A light emitting module includes a first light emitter that emits light having a first color temperature and a second light emitter that emits light having a second color temperature higher than the first color temperature. The first light emitter includes a first light emitting element and a first sealant. The first sealant seals the first light emitting element and includes a first wavelength converter that converts a wavelength of light emitted by the first light emitting element. The second light emitter includes a second light emitting element and a second sealant. The second sealant seals the second light emitting element and includes a second wavelength converter that converts a wavelength of light emitted by the second light emitting element. In a plan view, the first light emitting element has a surface area greater than a surface area of the second light emitting element.

20 Claims, 6 Drawing Sheets

(51) Int. Cl.
   *F21V 7/00*     (2006.01)
   *F21V 9/08*     (2018.01)
   *F21V 29/76*    (2015.01)
   *H01L 33/50*    (2010.01)
   *H05B 33/08*    (2006.01)
   *F21Y 103/10*   (2016.01)
   *F21Y 105/10*   (2016.01)
   *F21Y 113/13*   (2016.01)
   *F21Y 115/10*   (2016.01)
   *H01L 25/075*   (2006.01)

(52) U.S. Cl.
   CPC .......... *F21V 29/76* (2015.01); *H01L 25/0753* (2013.01); *H05B 33/0803* (2013.01); *H05B 33/0845* (2013.01); *H05B 33/0857* (2013.01); *F21Y 2103/10* (2016.08); *F21Y 2105/10* (2016.08); *F21Y 2113/13* (2016.08); *F21Y 2115/10* (2016.08); *H01L 33/504* (2013.01)

(58) Field of Classification Search
   CPC .............. H01L 33/504; H05B 33/0803; H05B 33/0857; F21Y 2113/13; F21Y 2103/10; F21Y 2105/10; F21Y 2115/10
   See application file for complete search history.

(56) References Cited

U.S. PATENT DOCUMENTS

2013/0092965 A1    4/2013  Kijima et al.
2013/0141013 A1*   6/2013  Kodama ............ H05B 33/0857
                                                    315/294

FOREIGN PATENT DOCUMENTS

| JP | 2011-49516  | 3/2011  |
| JP | 2011-176017 | 9/2011  |
| JP | 2011-249316 | 12/2011 |
| JP | 2014-49504  | 3/2014  |

\* cited by examiner

LIGHT EMITTING MODULE AND LIGHTING APPARATUS

CROSS REFERENCE TO RELATED APPLICATION

This application claims the benefit of priority of Japanese Patent Application Number 2016-046362 filed on Mar. 9, 2016, the entire content of which is hereby incorporated by reference.

BACKGROUND

1. Technical Field

The present disclosure relates to a light emitting module including a light emitting element such as a light emitting diode (LED), and a lighting apparatus including the light emitting module.

2. Description of the Related Art

Semiconductor light emitting elements, such as LEDs, are widely used as light sources in a variety of devices due to their high efficiency and long life span. For example, LEDs are used as light sources for illumination purposes in, for example, lamps or lighting apparatuses, as well as light sources for backlights in liquid crystal displays.

Typically, LEDs are installed in the devices or apparatuses as an integrated unit referred to as an LED module. A LED module includes, for example, a substrate and one or more LEDs mounted on the substrate (see, for example, Japanese Unexamined Patent Application Publication No. 2011-176017).

SUMMARY

Recent years have seen advances in the development of color adjustable LED modules. A color adjustable LED module includes a plurality of light emitters that emit light having different color temperatures. For example, a color adjustable LED module includes a low color-temperature light emitter that emits light having a low color temperature of 2500K and a high color-temperature light emitter that emits light having a high color temperature of 6000K. The low color-temperature light emitter and the high color-temperature light emitter each include, for example, an LED chip and a sealant. The sealant seals the LED chip and contains phosphor. The light emitters emit light having a desired color temperature by adjusting the type or amount of phosphor used. In such an LED module, white light of a desired color temperature can be emitted in a range from 2500K to 6000K by changing the dimming ratio of the low color-temperature light emitter and the dimming ratio of the high color-temperature light emitter.

However, the luminous flux of the low color-temperature light emitter is lower than the high color-temperature light emitter since the wavelength conversion efficiency by the phosphor is lower. Therefore, in a low color-temperature driving mode in which the dimming ratio for the low color-temperature light emitter is increased, the total luminous flux of the LED module decreases.

It is conceivable to compensate for the decrease in luminous flux of the low color-temperature light emitter in the low color-temperature driving mode by increasing the number of LED chips connected in series in the low color-temperature light emitter. However, increasing the number of LED chips connected in series in the low color-temperature light emitter results in there being an uneven number of LED chips connected in series between the low color-temperature light emitter and the high color-temperature light emitter, which reduces power supply precision due to the difference in drive voltage between the low color-temperature light emitter and high color-temperature light emitter, and reduces, for example, reliability, due to the increase in LED chip temperature in accordance with the increase in input power.

The present disclosure has been conceived to overcome the above problem, and has an object to provide a color adjustable light emitting module and lighting apparatus capable of inhibiting a decrease in total luminous flux in a low color-temperature driving mode without changing the number of light emitting elements used.

In order to achieve the above object, a light emitting module according to one aspect of the present disclosure includes a first light emitter that emits light having a first color temperature and a second light emitter that emits light having a second color temperature higher than the first color temperature. The first light emitter includes a first light emitting element and a first sealant. The first sealant seals the first light emitting element and includes a first wavelength converter that converts a wavelength of light emitted by the first light emitting element. The second light emitter includes a second light emitting element and a second sealant. The second sealant seals the second light emitting element and includes a second wavelength converter that converts a wavelength of light emitted by the second light emitting element. In a plan view, the first light emitting element has a surface area greater than a surface area of the second light emitting element.

Moreover, a light emitting module according to another aspect of the present disclosure includes a first light emitter that emits light having a first color temperature and a second light emitter that emits light having a second color temperature higher than the first color temperature. The first light emitter includes a first light emitting element and a first sealant. The first sealant seals the first light emitting element and includes a first wavelength converter that converts a wavelength of light emitted by the first light emitting element. The second light emitter includes a second light emitting element and a second sealant. The second sealant seals the second light emitting element and includes a second wavelength converter that converts a wavelength of light emitted by the second light emitting element. The first light emitting element has a height less than a height of the second light emitting element.

Moreover, a lighting apparatus according to one aspect of the present disclosure includes any one of the above-described light emitting modules.

According to the present disclosure, it is possible to inhibit a decrease in total luminous flux in a low color-temperature driving mode without changing the number of light emitting elements used.

BRIEF DESCRIPTION OF DRAWINGS

The figures depict one or more implementations in accordance with the present teaching, by way of examples only, not by way of limitations. In the figures, like reference numerals refer to the same or similar elements.

DETAILED DESCRIPTION OF THE EMBODIMENTS

Figure 1:
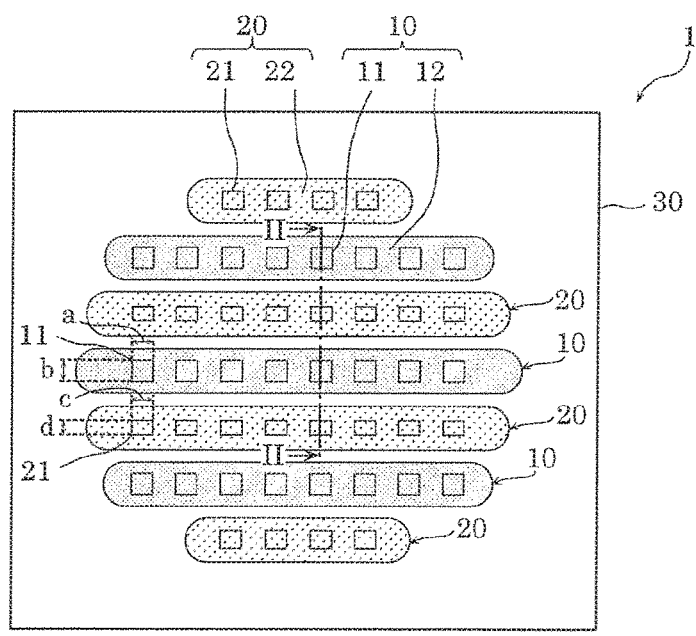
FIG. 1 is a plan view of the light emitting module according to Embodiment 1.

The following describes embodiments of the present disclosure with reference to the drawings. Note that the embodiments described below each show a specific example of the present disclosure. The numerical values, shapes, materials, elements, the arrangement and connection of the elements, etc., indicated in the following embodiments are mere examples, and therefore do not intend to limit the inventive concept. Therefore, among elements in the following embodiments, those not recited in any of the independent claims defining the most generic part of the inventive concept are described as optional elements.

Note that the drawings are represented schematically and are not necessarily precise illustrations. As such, the scaling, etc., depicted in the drawings is not necessarily accurate. Additionally, like reference signs indicate like elements in the drawings, and overlapping descriptions thereof are omitted or simplified.

Embodiment 1

Figure 2:
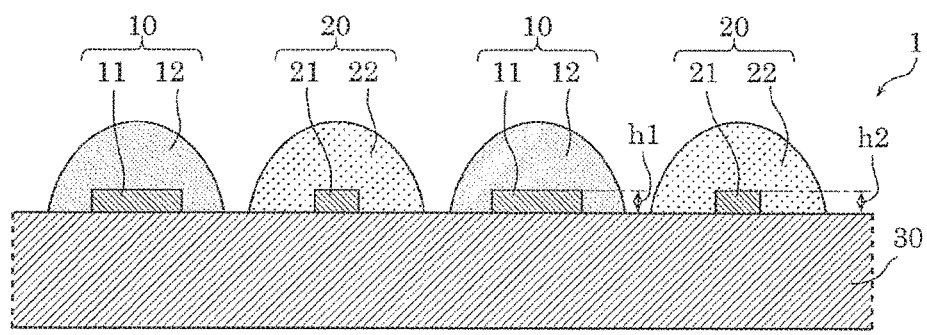
FIG. 2 is a cross sectional view of the light emitting module according to Embodiment 1, taken along line II-II in FIG. 1.

The configuration of light emitting module 1 according to Embodiment 1 will be described with reference to FIG. 1 and FIG. 2. FIG. 1 is a plan view of light emitting module 1 according to Embodiment 1. FIG. 2 is a cross sectional view of light emitting module 1 taken along line II-II in FIG. 1.

As illustrated in FIG. 1 and FIG. 2, light emitting module 1 includes first light emitters 10, second light emitters 20 having a different color temperature (light emission color) than first light emitters 10, and substrate 30 on which first light emitters 10 and second light emitters 20 are disposed.

In this embodiment, each of first light emitters 10 and second light emitters 20 has an elongated, linear shape. More specifically, first light emitters 10 and second light emitters 20 are alternately arranged line by line, in a widthwise direction of each of first light emitters 10 and second light emitters 20.

First light emitters 10 emit light having a first color temperature. Second light emitters 20 emit light having a second color temperature higher than the first color temperature. In other words, first light emitters 10 are low color-temperature light emitters that emit light having a low color temperature as the first color temperature, and second light emitters 20 are high color-temperature light emitters that emit light having a high color temperature as the second color temperature. In one example, first light emitters 10 emit white light having a color temperature of 2500K, and second light emitters 20 emit white light having a color temperature of 6000K.

With light emitting module 1 configured as described above, color adjustment of light emitting module 1 can be performed by adjusting the dimming ratios (light output ratios) of first light emitters 10 and second light emitters 20. More specifically, white light having a desired color temperature can be emitted in a range from 2500K to 6000K by changing the dimming ratios of first light emitters 10 and second light emitters 20.

Moreover, light emitting module 1 according to this embodiment is an LED module having a COB configuration in which LED chips are directly mounted on substrate 30. Hereinafter, elements included in light emitting module 1 will be described in detail.

First light emitters 10 each include first light emitting elements 11 and first sealant 12. First sealant 12 seals first light emitting elements 11 and includes a first wavelength converter that converts the wavelength (i.e., color) of light emitted by first light emitting elements 11.

Second light emitters 20 each include second light emitting elements 21 and second sealant 22. Second sealant 22 seals second light emitting elements 21 and includes a second wavelength converter that converts the wavelength (i.e., color) of light emitted by second light emitting elements 21.

In each first light emitter 10, first light emitting elements 11 are arranged linearly, and first sealant 12 extends linearly along the linearly arranged first light emitting elements 11. First sealant 12 collectively seals first light emitting elements 11 arranged in a single line.

In each second light emitter 20, second light emitting elements 21 are arranged linearly, and second sealant 22 extends linearly along the linearly arranged second light emitting elements 21. Second sealant 22 collectively seals second light emitting elements 21 arranged in a single line.

First light emitting elements 11 and second light emitting elements 21 are, for example, LED chips. More specifically, first light emitting elements 11 and second light emitting elements 21 are bare chips that emit monochromatic visible light. In one example, first light emitting elements 11 and second light emitting elements 21 are blue light LED chips that emit blue light when applied with electricity, and are gallium nitride (GaN) semiconductor light emitting elements having a main peak wavelength between from 440 nm to 470 nm. Note that first light emitting elements 11 may be LED chips that emit light having a different peak wavelength than the peak wavelength of the light emitted by second light emitting elements 21.

Each first light emitting element 11 and second light emitting element 21 is directly mounted on substrate 30. More specifically, each first light emitting element 11 and second light emitting element 21 is die bonded to substrate 30 via a die attach material.

In each first light emitter 10, first light emitting elements 11 are electrically connected in series. For example, adjacent first light emitting elements 11 may be directly connected by wire (i.e., in a chip-to-chip configuration), and adjacent first light emitting elements 11 may be connected via wire bonding to a metal line formed on substrate 30. In this embodiment, first light emitting elements 11 in all first light emitters 10 are connected in series. In other words, all first light emitting elements 11 on substrate 30 are connected in series. Note that each first light emitting element 11 may have the same forward voltage (VF) characteristic.

In each second light emitter 20, second light emitting elements 21 are electrically connected in series. Second light emitting elements 21 are connected by wire via the same method used for first light emitting elements 11. In this embodiment, second light emitting elements 21 in all second light emitters 20 are connected in series. In other words, all second light emitting elements 21 on substrate 30 are connected in series. Note that each second light emitting element 21 may have the same forward voltage (VF) characteristic.

Furthermore, second light emitting elements 21 and first light emitting elements 11 may have the same VF characteristic. In other words, in this embodiment, first light emitting elements 11 and second light emitting elements 21 disposed on substrate 30 are all blue light LED chips having the same VF characteristic.

Note that first light emitting elements 11 and second light emitting elements 21 may be configured to be driven independently from one another, and may be configured to be driven in conjunction with one another.

First sealant 12 includes phosphor as the first wavelength converter. More specifically, first sealant 12 includes phosphor and a light transmissive material containing phosphor. The phosphor included in first sealant 12 emits fluorescence upon being excited by light emitted from first light emitting elements 11 functioning as excitation light. The wavelength of the light emitted by the phosphor is different from the wavelength of the light emitted by first light emitting elements 11. First sealant 12 is formed on substrate 30 so as to cover first light emitting element 11.

Similarly, second sealant 22 includes phosphor as the second wavelength converter. More specifically, second sealant 22 includes phosphor and a light transmissive material containing phosphor. The phosphor included in second sealant 22 emits fluorescent light upon excitation by light emitted from second light emitting elements 21 functioning as excitation light. The wavelength of the light emitted by the phosphor is different from the wavelength of the light emitted by second light emitting elements 21. Second sealant 22 is formed on substrate 30 so as to cover second light emitting elements 21.

In this embodiment, since first light emitting elements 11 and second light emitting elements 21 are blue light LED chips, in order to obtain white light, first sealant 12 and second sealant 22 contain, for example, yttrium aluminum garnet (YAG) yellow phosphor. With this, a portion of the blue light emitted by the blue light LED chips is absorbed by the yellow phosphor and undergoes wavelength conversion producing yellow light. In other words, the yellow phosphor emits yellow light as a result of being excited by blue light from the blue light LED chips. White light is produced as a composite light of the yellow light from the yellow phosphor and the blue light not absorbed by the yellow phosphor, whereby white light is emitted from first sealant 12 and second sealant 22.

However, second light emitters 20 emit light having a higher color temperature than the color temperature of the light emitted by first light emitters 10. Consequently, to increase the color temperature of the light emitted by second light emitters 20 beyond the color temperature of the light emitted by first light emitters 10, the color temperatures of first light emitters 10 and second light emitters 20 are adjusted by, for example, adjusting the type (for example, red phosphor, green phosphor, blue phosphor) and amount of phosphor contained in first sealant 12 and second sealant 22

For example, in addition to yellow phosphor, second sealant 22 also contains red phosphor and green phosphor. This makes it possible to increase the color temperature of second light emitters 20. Accordingly, by adjusting the type or amount of phosphor contained in second sealant 22 and first sealant 12, it is possible to increase the color temperature of the light emitted by second light emitters 20 beyond the color temperature of the light emitted by first light emitters 10. Note that in order to increase yellowness, first sealant 12 may also contain red phosphor.

For example, a light transmissive and electrically insulating resin, such as silicon resin, epoxy resin, or fluorine resin, can be used as the light transmissive material included in first sealant 12 and second sealant 22. First sealant 12 and second sealant 22 according to this embodiment are made from a phosphor-containing resin produced by dispersing phosphor in silicon resin serving as the light transmissive material.

First sealant 12 is formed by, for example, applying a sealant material to substrate 30 using a dispenser, so as to cover first light emitting elements 11, and forming first sealant 12 into a predetermined shape by hardening the sealant material. Second sealant 22 can be formed with the same method used to form first sealant 12. In this embodiment, first sealant 12 and second sealant 22 each have a shape of an approximate half cylinder.

Note that first sealant 12 and second sealant 22 may be dispersed with, for example, a light diffusing material, such as silica, to increase the light diffusing properties, and may be dispersed with a filler for inhibiting the phosphor from sinking.

Substrate 30 is a mounting substrate for mounting first light emitting elements 11 and second light emitting elements 21. For example, a resin-based resin substrate, a ceramic substrate, a metal-based substrate, or a glass substrate may be used as substrate 30.

For example, a glass epoxy substrate made from fiberglass and epoxy resin (CEM-3, FR-4, etc.), a substrate made from phenolic paper or epoxy paper (FR-1, etc.), or a flexible substrate made from, for example, polyimide, can be used as the resin substrate. For example, an alumina substrate (for example, a white polycrystalline alumina substrate), or an aluminum nitride substrate can be used as the ceramic substrate. For example, an aluminum alloy substrate, an iron alloy substrate, or a copper alloy substrate whose surfaces are covered with an electrically insulating film can be used as the metal-based substrate. Moreover, a double-sided substrate formed by coating a copper thin film on both sides of a resin (for example, CEM-3) substrate can also be used. Note that substrate 30 may be a light transmissive substrate, and, alternatively, may be a non-light-transmissive substrate.

Moreover, as one example, an oblong rectangular substrate can be used for substrate 30, but the shape of substrate 30 is not particularly limited. For example, substrate 30 may have the shape of a regular polygon, such as a square, or a circle in a plan view.

Although not illustrated in the drawings, note that metal lines may be patterned on substrate 30 for supplying power to first light emitting elements 11 and second light emitting elements 21, and a pair of power supply terminals which receive power from an external source and supply the power to first light emitting elements 11 and second light emitting elements 21 to cause first light emitting elements 11 and second light emitting elements 21 to emit light.

Moreover, a white resist made from a white electrically insulating resin film may be formed on the surface of substrate 30. Forming this white resist increases the reflectivity of the surface of substrate 30, making it possible to increase the light extraction rate of the light emitting module. Moreover, forming this white resist makes it possible to increase the dielectric strength voltage of substrate 30 and prevent the metal lines from oxidizing.

As illustrated in FIG. 1, with light emitting module 1 configured as described above, the plan view surface area of each first light emitting element 11 in first light emitters 10

(low color-temperature light emitters) is greater than the plan view surface area of each second light emitting element 21 in second light emitters 20 (high color-temperature light emitters). In other words, first light emitting elements 11 and second light emitting elements 21 are selected such that the surface area of the top surface (chip top surface) of each first light emitting element 11 is greater than the surface area of the top surface (chip top surface) of each second light emitting element 21.

Figure 3:
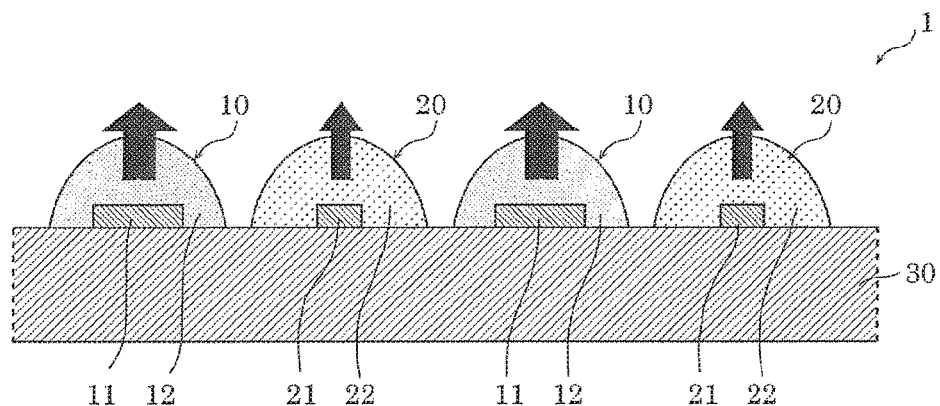
FIG. 3 schematically illustrates an operational advantage of the light emitting module according to Embodiment 1.

With this configuration, as illustrated in FIG. 3, the amount of light extracted from the top surfaces of first light emitting elements 11 is greater than the amount of light extracted from the top surfaces of second light emitting elements 21. In other words, the luminous flux on the top surfaces of first light emitting elements 11 is greater than the luminous flux on the top surfaces of second light emitting elements 21. Accordingly, when light emitting module 1 is driven in a low color-temperature driving mode (i.e., when light emitting module 1 is driven such that the dimming ratio of first light emitters 10, which are the low color-temperature light emitters, is higher than the dimming ratio of second light emitters 20, which are the high color-temperature light emitters), the total luminous flux of light emitting module 1 can be inhibited from decreasing.

Moreover, as illustrated in FIG. 1, first light emitters 10 and second light emitters 20 are alternately arranged, and first light emitting elements 11 and second light emitting elements 21 are adjacent one another. More specifically, since first light emitters 10 and second light emitters 20 are alternately arranged line by line, each first light emitting element 11 and each second light emitting element 21 are individually alternately arranged.

In this embodiment, first light emitting elements 11 and second light emitting elements 21 each have a rectangular plan view shape. In this case, in the plan view, when the length, a, of first light emitting element 11 is along a side adjacent to second light emitting element 21, and a length, b, of first light emitting element 11 is along a side perpendicular to the side adjacent to second light emitting element 21, the plan view surface area of first light emitting element 11 is expressed as a×b. Moreover, in the plan view, when the length, c, of second light emitting element 21 is along a side adjacent to first light emitting element 11, and the length, d, of second light emitting element 21 is along a side perpendicular to the side adjacent to first light emitting element 11, the plan view surface area of second light emitting element 21 is expressed as c×d.

Moreover, the plan view aspect ratio of first light emitting element 11 (a/b) is smaller than the plan view aspect ratio of second light emitting element 21 (c/d). In other words, a/b<c/d, and first light emitting element 11 is closer in shape to a square than second light emitting element 21. More specifically, first light emitting element 11 has a square plan view shape where a/b=1. Moreover, second light emitting element 21 has an oblong rectangle plan view shape, where c>d. Second light emitting elements 21 are arranged such that the longitudinal sides of each of second light emitting elements 21 extend along the direction in which second light emitting elements 21 are arranged. In other words, the longitudinal sides of each second light emitting element 21 extend along a direction that is substantially the same as the longitudinal direction of each second sealant 22.

Note that the plan view aspect ratio of first light emitting element 11 (a/b) and the plan view aspect ratio of second light emitting element 21 may each be between from 1 to 3. In other words, 1≤a/b≤3 and 1≤c/d≤3.

Moreover, as illustrated in FIG. 2, in this embodiment, height h1 of first light emitting element 11 and height h2 of second light emitting element 21 are the same.

According to this embodiment, light emitting module 1 includes first light emitters 10, which are low color-temperature light emitters, and second light emitters 20, which are high color-temperature light emitters, and the plan view surface area of each first light emitting element 11 in first light emitters 10 is greater than the plan view surface area of each second light emitting element 21 in second light emitters 20.

This configuration makes it possible to achieve light emitting module 1 capable of inhibiting a decrease in total luminous flux in a low color-temperature driving mode without changing the number of light emitting elements (LED chips) used.

Embodiment 2

Figure 4:
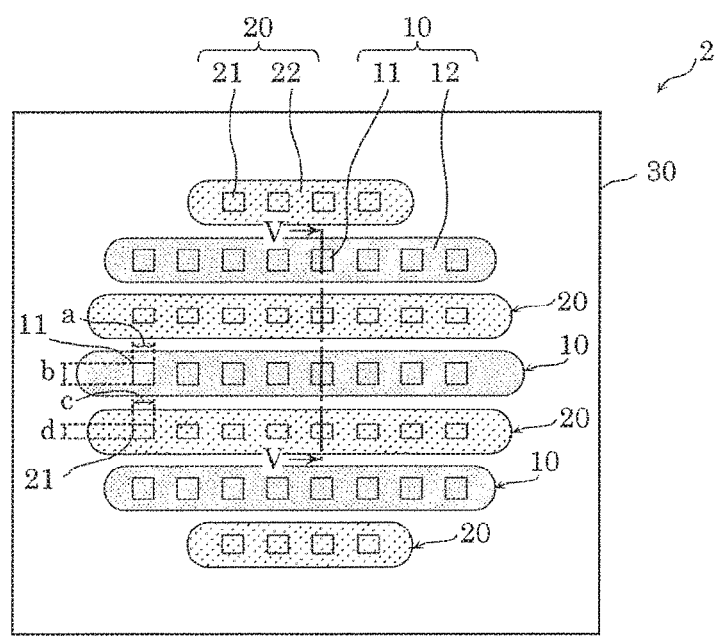
FIG. 4 is a plan view of the light emitting module according to Embodiment 2.
Figure 5:
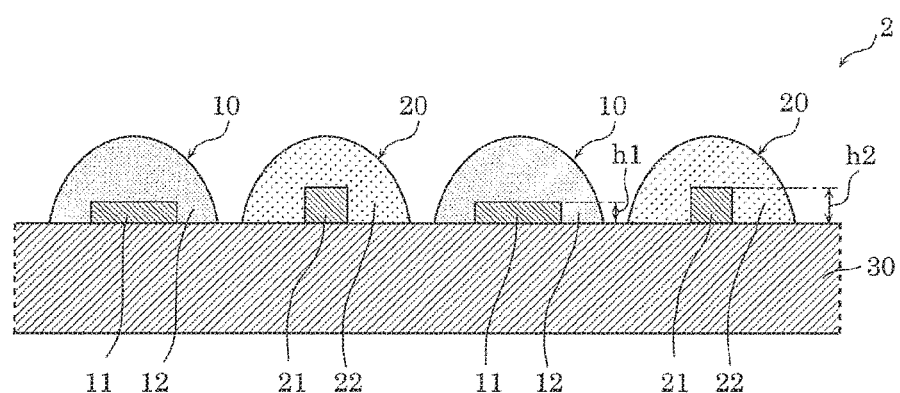
FIG. 5 is a cross sectional view of the light emitting module according to Embodiment 2, taken along line V-V in FIG. 4.
Figure 6:
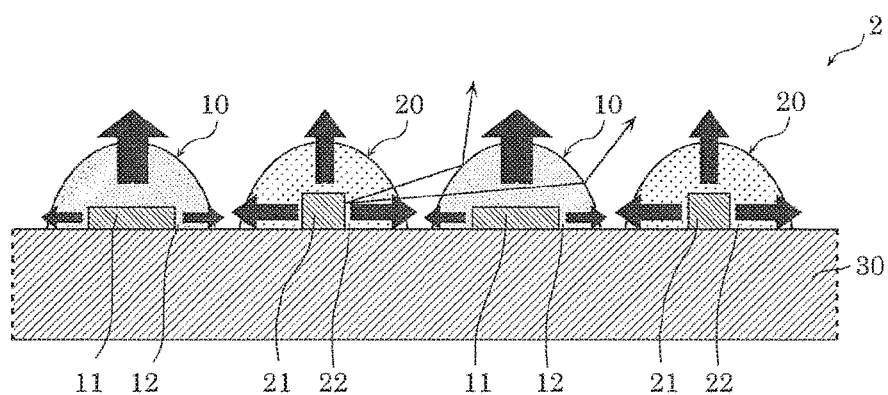
FIG. 6 schematically illustrates an operational advantage of the light emitting module according to Embodiment 2.

Next, light emitting module 2 according to Embodiment 2 will be described with reference to FIG. 4 through FIG. 6. FIG. 4 is a plan view of light emitting module 2 according to Embodiment 2. FIG. 5 is a cross sectional view of light emitting module 2 taken along line V-V in FIG. 4. FIG. 6 schematically illustrates an operational advantage of light emitting module 2, and FIG. 5 corresponds to a cross sectional view.

As illustrated in FIG. 4 and FIG. 5, similar to light emitting module 1 according to Embodiment 1, light emitting module 2 according to this embodiment includes first light emitters 10 and second light emitters 20 having mutually different color temperatures, and substrate 30 on which first light emitters 10 and second light emitters 20 are disposed.

Light emitting module 2 according to this embodiment and light emitting module 1 according to Embodiment 1 are different in regard to the dimensional relationship between the heights of first light emitting elements 11 and second light emitting elements 21. More specifically, with light emitting module 1 according to Embodiment 1, height h1 of each first light emitting element 11 and height h2 of each second light emitting element 21 are the same, but with light emitting module 2 according to this embodiment, height h1 of each first light emitting element 11 in first light emitters 10 (low color-temperature light emitters) is less than height h2 of each second light emitting element 21 in second light emitters 20 (high color-temperature light emitters), as illustrated in FIG. 5. In other words, first light emitting elements 11 and second light emitting elements 21 are selected such that height h1 of each first light emitting element 11 is less than height h2 of each second light emitting element 21.

With this configuration, as illustrated in FIG. 6, the amount of light extracted from the lateral side surfaces of second light emitting elements 21 is greater than the amount of light extracted from the lateral side surfaces of first light emitting elements 11. In other words, the luminous flux on the lateral side surfaces of second light emitting elements 21 is greater than the luminous flux on the lateral side surfaces of first light emitting elements 11.

With this, the amount of fluorescent light emitted from the phosphor in first sealant 12 can be increased by the light emitting from the lateral sides of second light emitting elements 21. For example, light emitted from second sealant 22 from among the light emitted from the lateral sides of second light emitting elements 21 is incident on first sealant 12 neighboring second sealant 22, resulting in the emission of fluorescence by the phosphor in first sealant 12. Accordingly, when light emitting module 2 is driven in a low color-temperature driving mode, the total luminous flux of light emitting module 2 can be inhibited from decreasing.

Moreover, by increasing the amount of light extracted from the lateral side surfaces of second light emitting elements 21 beyond the amount of light extracted from the lateral side surfaces of first light emitting elements 11, the color mixture characteristics of light emitted from first light emitters 10 (first sealant 12) and second light emitters 20 (second sealant 22) can be improved. This makes it possible to increase the color homogeneity of light emitting module 2. In other words, this makes it possible to reduce unevenness due to differences in chromaticity (i.e., unevenness in color) and unevenness due to differences in contrast (i.e., unevenness in luminance).

Moreover, in this embodiment, similar to Embodiment 1, the plan view surface area of each first light emitting element 11 in first light emitters 10 (low color-temperature light emitters) is greater than the plan view surface area of each second light emitting element 21 in second light emitters 20 (high color-temperature light emitters).

In other words, height h1 of each first light emitting element 11 is less than height h2 of each second light emitting element 21, and the surface area of the chip top surface of each first light emitting element 11 is greater than the surface area of the chip top surface of each second light emitting element 21. In other words, with regard to first light emitting elements 11, the proportion of the luminous flux of light emitting from the lateral side surfaces is reduced and the proportion of the luminous flux of light emitting from the top surfaces is increased.

In other words, height h2 of each second light emitting element 21 is greater than height h1 of each first light emitting element 11, and the surface area of the chip top surface of each second light emitting element 21 is less than the surface area of the chip top surface of each first light emitting element 11. In other words, with regard to second light emitting elements 21, the proportion of the luminous flux of light emitting from the top surfaces is reduced and the proportion of the luminous flux of light emitting from the lateral side surfaces is increased.

With this configuration, the amount of light extracted from the top surfaces of first light emitting elements 11 is greater than the amount of light extracted from the top surfaces of second light emitting elements 21 since the top view surface area of each first light emitting element 11 is greater than the top view surface area of each second light emitting element 21. Accordingly, compared to Embodiment 1, when light emitting module 2 is driven in a low color-temperature driving mode, the total luminous flux of light emitting module 2 can be further inhibited from decreasing.

Moreover, regarding first light emitting elements 11, since the proportion of the luminous flux of light emitting from the lateral side surfaces is reduced and the proportion of the luminous flux of light emitting from the top surfaces is increased, the total luminous flux of a lighting apparatus equipped with light emitting module 2 can be inhibited from decreasing. In other words, when a lighting apparatus is equipped with light emitting module 2, distribution of light emitting from the lateral side surfaces of first light emitters 10 from, for example, the light emitting from first light emitting elements 11, is controlled by, for example, a reflector or lens in the lighting apparatus, but in this case, light emitting from the lateral side surfaces of first light emitters 10 is absorbed by, for example, the reflector or lens, which reduces the amount of light. In contrast, in this embodiment, regarding first light emitting elements 11, since the proportion of the luminous flux of light emitting from the side surfaces is reduced and the proportion of the luminous flux of light emitting from the top surfaces is increased, when a lighting apparatus is equipped with light emitting module 2, the amount of light incident on, for example, a reflector or lens decreases and the amount of light absorbed by, for example, the reflector or lens decreases, making it possible to inhibit a decrease in the total luminous flux of the lighting apparatus.

With light emitting module 2 according to this embodiment, height h1 of each first light emitting element 11 in first light emitters 10 (low color-temperature light emitters) is less than height h2 of each second light emitting element 21 in second light emitters 20 (high color-temperature light emitters).

This configuration makes it possible to achieve light emitting module 2 capable of inhibiting a decrease in total luminous flux in a low color-temperature driving mode without changing the number of light emitting elements (LED chips) used, and capable of improving color homogeneity.

Moreover, with this embodiment, the plan view surface area of each first light emitting element 11 is greater than the plan view surface area of each second light emitting element 21.

Accordingly, when light emitting module 2 is driven in a low color-temperature driving mode, the total luminous flux of light emitting module 2 can be further inhibited from decreasing.

Moreover, with this embodiment, similar to Embodiment 1, the plan view aspect ratio of first light emitting element 11 (a/b) is smaller than the plan view aspect ratio of second light emitting element 21 (c/d). In other words, a/b<c/d, and first light emitting element 11 is closer in shape to a square, and second light emitting element 21 is closer in shape to an oblong rectangle.

In this case, the longitudinal length of the chip can be increased by increasing the aspect ratio of the oblong rectangle while keeping the surface areas of the chip top surfaces the same. Therefore, by satisfying a/b<c/d, the amount of light extracted from the lateral side surfaces of second light emitting elements 21 is greater than the amount of light extracted from the lateral side surfaces of first light emitting elements 11. This makes it easy to increase the luminous flux on the lateral side surfaces of second light emitting elements 21 beyond the luminous flux on the lateral side surfaces of first light emitting elements 11.

Moreover, in this embodiment, similar to Embodiment 1, a plurality of first light emitting elements 11 and a plurality of second light emitting elements 21 are provided and each individually alternately arranged.

This makes it possible to further increase the color homogeneity of light emitting module 2.

Moreover, in this embodiment, similar to Embodiment 1, in each first light emitter 10, first light emitting elements 11 are arranged linearly, and in each second light emitter 20, second light emitting elements 21 are arranged linearly. Furthermore, first sealant 12 extends linearly along the linearly arranged first light emitting elements 11, and second sealant 22 extends linearly along the linearly arranged second light emitting elements 21.

This makes it possible to easily form first sealant 12 and second sealant 22 on substrate 30.

Moreover, in this embodiment, each second light emitting element 21 has an oblong rectangle plan view shape, and second light emitting elements 21 are arranged such that the longitudinal sides of each of second light emitting elements 21 extend along a direction in which second light emitting elements 21 are arranged.

With this, the amount of light extracted from the lateral side surfaces of second light emitting elements 21 is greater than the amount of light extracted from the lateral side surfaces of first light emitting elements 11. This makes it easy to increase the luminous flux on the lateral side surfaces of second light emitting elements 21 beyond the luminous flux on the lateral side surfaces of first light emitting elements 11.

Embodiment 3

Figure 7:
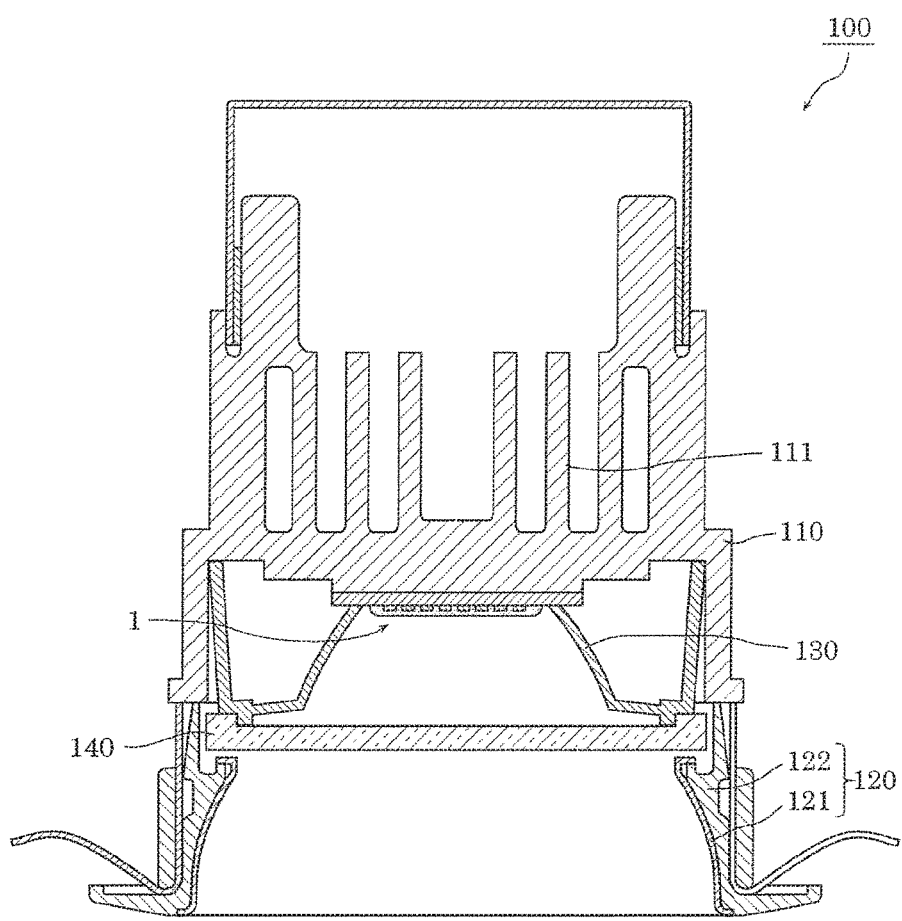
FIG. 7 is a cross sectional view of the lighting apparatus according to Embodiment 3.
Figure 8:
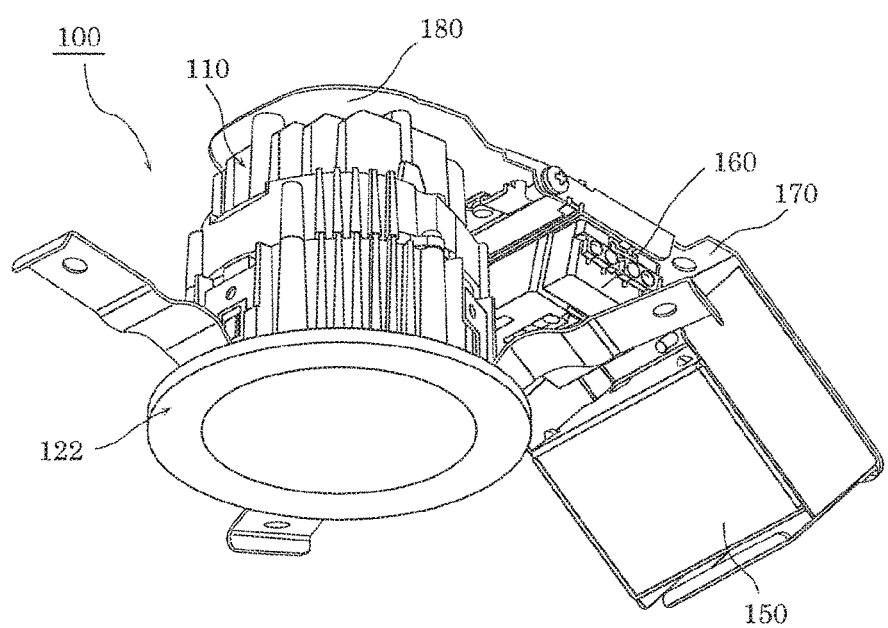
FIG. 8 is an external perspective view of the lighting apparatus according to Embodiment 3.

Next, lighting apparatus 100 according to Embodiment 3 will be described with reference to FIG. 7 and FIG. 8. FIG. 7 is a cross sectional view of lighting apparatus 100 according to Embodiment 3. FIG. 8 is an external perspective view of lighting apparatus 100 according to Embodiment 3.

As illustrated in FIG. 7 and FIG. 8, lighting apparatus 100 according to this embodiment is a recessed lighting apparatus, such as a down light, which emits light downward (toward the floor or a wall, for example) as a result of being installed recessed in the ceiling of, for example, a house. Lighting apparatus 100 includes light emitting module 1 according to Embodiment 1, a bottomed, substantially cylindrical fixture body resulting from base 110 and frame body 120 being coupled together, reflective plate 130 disposed in the fixture body, and light transmissive panel 140 disposed in the fixture body.

Base 110 is an attachment pedestal to which light emitting module 1 attaches, and is a heat sink that radiates heat generated by light emitting module 1. Base 110 is formed from metal so as to have a substantially circular cylindrical shape, and in this embodiment, is cast aluminum.

Base 110 includes, on the top portion (i.e., the ceiling side of base 110), a plurality of heat radiating fins 111 that protrude upward and are provided spaced evenly apart along one direction. With this, the heat generated by light emitting module 1 can be effectively radiated.

Frame body 120 includes substantially circular cylindrical cone body 121 having an inner reflective surface, and frame main body 122 to which cone body 121 attaches. Cone body 121 is made from metal and, for example, can be produced by raising or stamping, for example, aluminum alloy. Frame main body 122 is made from a hard resin or metal. Frame body 120 is fixed by frame main body 122 being attached to base 110.

Reflective plate 130 is a torus shaped (funnel shaped) reflective component whose inner surface functions as a reflective surface. Reflective plate 130 can be made from metal such as aluminum. Note that reflective plate 130 may be made from a hard white resin instead of metal.

Light transmissive panel 140 is a light transmissive component having both light diffusion and light transmission properties. Light transmissive panel 140 is a flat plate disposed between reflective plate 130 and frame body 120, and is attached to reflective plate 130. Light transmissive panel 140 can be formed into a disc-like shape from a transparent resin such as acrylic or polycarbonate.

Note that light transmissive panel 140 may be omitted. By omitting light transmissive panel 140, it is possible to increase the luminous flux of light emitted by the lighting apparatus.

Moreover, as illustrated in FIG. 8, illumination apparatus 150 and terminal base 160 are connected to lighting apparatus 100. Illumination apparatus 150 supplies power for illuminating light emitting module 1, and terminal base 160 relays AC power from a utility power source to illumination apparatus 150.

Illumination apparatus 150 and terminal base 160 are fixed to attachment plate 170 provided as a separate component from the fixture body. Attachment plate 170 is formed by bending a rectangular metal plate. Illumination apparatus 150 is fixed to the bottom surface at one lengthwise end of attachment plate 170, terminal base 160 is fixed to the bottom surface of the other lengthwise end. Attachment plate 170 and ceiling plate 180, which is fixed to the top portion of base 110 of the fixture body, are coupled together.

Note that in this embodiment, light emitting module 1 according to Embodiment 1 is used, but light emitting module 2 according to Embodiment 2 may be used Variation Hereinbefore, the light emitting module and lighting apparatus according to the present disclosure have been described based on embodiments, but the light emitting module and lighting apparatus are not limited to the above embodiments.

Figure 9:
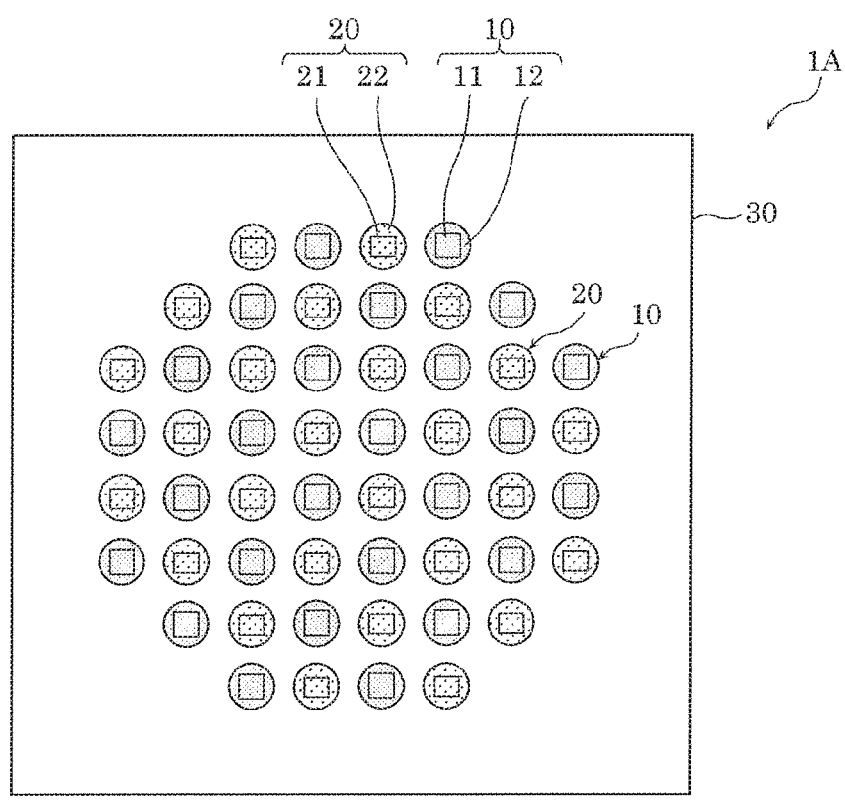
FIG. 9 is a plan view of a light emitting module according to a variation.

For example, in the above embodiments, first light emitters 10 and second light emitters 20 are linearly arranged, but this example is not limiting; first light emitters 10 and second light emitters 20 may be arranged in dot-like shapes, as is the case with light emitting module 1A illustrated in FIG. 9. In this case, for example, first sealant 12 and second sealant 22 can be formed in semicircular shapes each of which individually seals a different LED chip. More specifically, each first light emitter 10 is configured of a single first light emitting element 11 and first sealant 12 covering the single first light emitting element 11. Similarly, each second light emitter 20 is configured of a single second light emitting element 21 and second sealant 22 covering the single second light emitting element 21. Note that first light emitters 10 and second light emitters 20 are arranged in a matrix, but this example is not limiting. Moreover, first light emitters 10 and second light emitters 20 are one after another in both the column direction and the row direction, but this example is not limiting.

Moreover, in each of the above embodiments, light emitting modules 1 and 2 are configured to emit white light by using blue light LED chips and yellow phosphor, but this example is not limiting. For example, emission of white light may be achieved using a combination of a phosphor-containing resin containing red phosphor and green phosphor and blue light LED chips.

Moreover, in each of the above embodiments, LED chips that emit light of a color other than blue may be used. For example, when ultraviolet LED chips, which emit ultraviolet light having a shorter wavelength than the light emitted by blue light LED chips, are used, a configuration may be used in which various color phosphors which emit light of the three base colors (red, green, and blue) upon being excited mainly by the ultraviolet light are used.

Moreover, in each of the above embodiments, phosphor is used as the wavelength converter, but this example is not limiting. For example, a material containing a substance that absorbs light of a specific wavelength and emits light of a different wavelength, such as a semiconductor, metal complex, organic dye, or pigment, may be used as the wavelength converter.

Moreover, in each of the above embodiments, light emitting modules 1 and 2 emit light having two different color temperatures (i.e., two types of colors), but this example is not limiting. For example, light emitting modules 1 and 2 may emit light having three or more different color temperatures (i.e., three or more types of colors). In this case, light emitting modules 1 and 2 use three light emitters that emit light having different color temperatures.

Moreover, in Embodiment 3, light emitting module 1 is applied to a down light, but this example is not limiting. For example, light emitting module 1 can be applied to a base light, a spot light, a bulb-shaped lamp, a straight-tube lamp, or some other lighting apparatus or lamp. Moreover, light emitting module 1 can be used in devices other than those used for illumination purposes.

While the foregoing has described one or more embodiments and/or other examples, it is understood that various modifications may be made therein and that the subject matter disclosed herein may be implemented in various forms and examples, and that they may be applied in numerous applications, only some of which have been described herein. It is intended by the following claims to claim any and all modifications and variations that fall within the true scope of the present teachings.

What is claimed is:

1. A light emitting module, comprising:
a first light emitter that emits light having a first color temperature; and
a second light emitter that emits light having a second color temperature higher than the first color temperature,
wherein the first light emitter includes a first light emitting element and a first sealant, the first sealant sealing the first light emitting element and including a first wavelength converter that converts a wavelength of light emitted by the first light emitting element,
the second light emitter includes a second light emitting element and a second sealant, the second sealant sealing the second light emitting element and including a second wavelength converter that converts a wavelength of light emitted by the second light emitting element, and
in a plan view, the first light emitting element has a surface area greater than a surface area of the second light emitting element.

2. The light emitting module according to claim 1, wherein
the first light emitting element and the second light emitting element are adjacently disposed and each have a rectangular shape in the plan view, and
wherein, in the plan view, a length, a, of the first light emitting element is along a side adjacent to the second light emitting element, a length, b, of the first light emitting element is along a side perpendicular to the side adjacent to the second light emitting element, a length, c, of the second light emitting element is along a side adjacent to the first light emitting element, a length, d, of the second light emitting element is along a side perpendicular to the side adjacent to the first light emitting element, and $a/b < c/d$.

3. The light emitting module according to claim 2, wherein $1 \leq a/b \leq 3$ and $1 \leq c/d \leq 3$.

4. The light emitting module according to claim 3, wherein $a/b = 1$ and $c > d$.

5. The light emitting module according to claim 1, wherein
the first light emitting element comprises a plurality of first light emitting elements and the second light emitting element comprises a plurality of second light emitting elements, and
each of the plurality of first light emitting elements and each of the plurality of second light emitting elements are individually alternately arranged.

6. The light emitting module according to claim 1, wherein
the first light emitting element comprises a plurality of first light emitting elements arranged linearly, and
the second light emitting element comprises a plurality of second light emitting elements arranged linearly.

7. The light emitting module according to claim 6, wherein
the first sealant extends linearly along the plurality of linearly arranged first light emitting elements, and
the second sealant extends linearly along the plurality of linearly arranged second light emitting elements.

8. The light emitting module according to claim 6, wherein
each of the plurality of second light emitting elements has a rectangular shape in a plan view defined by longitudinal and lateral sides, and
the plurality of second light emitting elements are arranged such that the longitudinal sides of each of the plurality of second light emitting elements extend along a direction in which the plurality of second light emitting elements are arranged.

9. The light emitting module according to claim 6, wherein
the plurality of first linearly arranged light emitting elements are connected in series, and
the plurality of second linearly arranged light emitting elements are connected in series.

10. The light emitting module according to claim 6, wherein
each of the plurality of first light emitting elements and second light emitting elements has a rectangular shape in a plan view defined by longitudinal and lateral sides, and
light extracted from lateral side surfaces of the plurality of second light emitting elements is greater than light extracted from lateral side surfaces of the plurality of first light emitting elements.

11. The light emitting module according to claim 1, wherein the first light emitting element emits light having a different peak wavelength than a peak wavelength of the light emitted by the second light emitting element.

12. The light emitting module according to claim 1, wherein
the first light emitting element and the second light emitting element comprise a plurality of first light emitting elements and a plurality of second light emitting elements, respectively, and
each of the plurality of first light emitting elements is configured with a single first light emitting element and first sealant covering the single first light emitting element, and
each of the plurality of second light emitting elements is configured with a single second light emitting element and second sealant covering the single second light emitting element.

13. The light emitting module according to claim 1, wherein the first sealant and the second sealant each individually seals an LED chip.

14. A lighting apparatus, comprising:
the light emitting module according to claim 1.

15. The lighting apparatus according to claim 14, further comprising a base and at least one heat radiating fin.

16. A light emitting module, comprising:
a first light emitter that emits light having a first color temperature; and
a second light emitter that emits light having a second color temperature higher than the first color temperature,
wherein the first light emitter includes a first light emitting element and a first sealant, the first sealant sealing the first light emitting element and including a first wavelength converter that converts a wavelength of light emitted by the first light emitting element, and
the second light emitter includes a second light emitting element and a second sealant, the second sealant sealing the second light emitting element and including a second wavelength converter that converts a wavelength of light emitted by the second light emitting element,
wherein a height of the first light emitting element is less than a height of the second light emitting element.

17. The light emitting module according to claim 16, wherein
in a plan view, the first light emitting element has a surface area greater than a surface area of the second light emitting element.

18. The light emitting module according to claim 16, wherein
a plan view aspect ratio of the first light emitting element is smaller than a plan view aspect ratio of the second light emitting element, and
a plan view aspect ratio is a length of a light emitting element relative to a width of the same light emitting element, wherein the width is in a direction between the first and second light emitters and the length is in a direction perpendicular to the width.

19. The light emitting module according to claim 16, wherein
an amount of light extracted from a top surface of the first light emitting element is greater than an amount of light extracted from a top surface of the second light emitting element.

20. The light emitting module according to claim 16, wherein
an amount of light extracted from a lateral side surface of the second light emitting element is greater than an amount of light extracted from a lateral side surface of the first light emitting element.

* * * * *